United States Patent [19]
Tsai et al.

[11] Patent Number: 6,083,824
[45] Date of Patent: Jul. 4, 2000

[54] BORDERLESS CONTACT

[75] Inventors: Chao-Chieh Tsai, Taichung, Taiwan; Chin-Hsiung Ho, Sunnyvale, Calif.; Yuan-Chen Sun, Katonah, N.Y.

[73] Assignee: Taiwan Semiconductor Manufacturing Company, Hsin-Chu, Taiwan

[21] Appl. No.: 09/114,132

[22] Filed: Jul. 13, 1998

[51] Int. Cl.[7] ............................................. H01L 21/4763
[52] U.S. Cl. ...................... 438/629; 438/631; 438/633; 438/638; 438/639; 438/666; 438/672; 438/687
[58] Field of Search .................... 438/629, 631, 438/633, 638, 639, 666, 672, 687

[56] References Cited

U.S. PATENT DOCUMENTS

| | | | |
|---|---|---|---|
| 4,966,870 | 10/1990 | Barber et al. | 437/228 |
| 5,605,862 | 2/1997 | Givens et al. | 437/180 |
| 5,612,254 | 3/1997 | Mu et al. | 437/195 |
| 5,656,543 | 8/1997 | Chung | 438/625 |
| 5,710,078 | 1/1998 | Tseng | 438/638 |
| 5,891,799 | 4/1999 | Tsui | 438/633 |
| 5,973,348 | 10/1999 | Ishibashi | 257/306 |
| 5,981,377 | 11/1999 | Koyama | 438/633 |
| 6,020,255 | 2/2000 | Tsai et al. | 438/672 |

OTHER PUBLICATIONS

Chang et al, "VLSI Technology" The McGraw–Hill Companies Inc. 1996, p. 446–447.

*Primary Examiner*—John F. Niebling
*Assistant Examiner*—Lynn A. Gurley
*Attorney, Agent, or Firm*—George O. Saile; Stephen B. Ackerman

[57] ABSTRACT

A method of forming borderless contacts and vias is disclosed. Borders which are conventionally provided in aligning contacts and vias to device and/or metal regions in a semiconductor device take up too much valuable real estate on semiconductor substrates, and hence reduce productivity of the products. By employing a hard-mask of this invention, and a specific sequence of process steps, alignment can be achieved without the need for borders. First, a thin nitride layer is deposited on an insulating layer formed over a substructure of a substrate having device and/or metal regions. The hard-mask is patterned with metal line openings, and a photoresist layer is formed with contact or via pattern over the already patterned hard-mask. The contact/via openings are etched into the dielectric layer until the substructure is reached. The hole openings are filled plug metal and then partially etched back, leaving a plug in the hole opening. The line trench is etched further into the dielectric layer until metal plug is reached. The trench is then filled with metal, such as aluminum-copper or copper and the excess is removed by chemical-mechanical polishing. Thus, a borderless and self-aligned interconnect comprising plug and metal line is formed.

36 Claims, 4 Drawing Sheets

BORDERLESS CONTACT

BACKGROUND OF THE INVENTION (1) Field of the Invention

The present invention relates to the manufacture of ultra large scale integrated (ULSI) circuit chips in general, and in particular, to forming interconnects in a semiconductor substrate by using a borderless contact process.

(2) Description of the Related Art

Interconnections between devices and other conductive layers separated from each other by insulating layers horizontally disposed in semiconductor substrates are made by vertical connections that are formed in the insulating layers. The vertical connections that contact the devices formed in the substrate are referred to as contacts while the vertical connections that connect the upper metal layers are referred to as vias. In either case, the challenge is to be able to make the vertical connections such that they lie squarely over the features that they are to connect. Any misalignment between the vertical connections and the features that they are to connect can cause defects and reliability problems. Thus, in order to assure that a vertical connection does fall within the intended feature, the features are made larger than required. The area by which the feature is made larger is called a border around the vertical contact hole or via hole. This increased area then impacts the packing density of the features, and hence the number of circuits that can be integrated into a semiconductor substrate. It is desirable, therefore, to eliminate the borders of prior art, that is, to form borderless contacts and vias in order to increase the integration levels of integrated circuits, and benefit from the attendant improvements in performance for the reasons known in the art. This invention discloses a method of forming such borderless contacts and vias.

As the very large and ultra large scale integration (VLSI and ULSI) of circuits progresses to even smaller feature sizes less than half micron, one of the most important challenges to be overcome is the level-to-level alignment in lithography, especially that of complex structures of metal line and contact interconnects. The packing density of circuits is limited to a large extent by how closely the interconnect metal between circuits can be formed without encroaching on each other. As is well known in the field, the limits are dictated by design rules that govern the separation of one level of contact from another, and by design rules for nesting tolerance or for borders used around contacts. The present invention discloses a method for forming interconnects without borders. The method is equally applicable to either a metal plug formed through a contact hole over a device in a substrate, or through a via hole connecting two metal layers at different levels in a substrate. It will be known to those skilled in the art that contacts refer to an interconnect which interconnects a source-drain device region, salicide of polysilicon to metal, while vias refer to an interconnect which connects metal to metal.

The effect on packing density of borders around contacts is well illustrated by S. M. Sze, et al., in an article published in ULSI Technology. FIGS. 1a, 2c in the drawings, adapted from Sze, show a gain of more than 62% in the packing area in going from a contact having borders to no borders. FIG. 1a shows fully bordered, staggered vias (23) and (33) formed between metal layers (20) and (30). Metal layers have been patterned to form metal lines (27) at the lower level and metal lines (37) on the upper level. Single and double primed reference numerals (27) and (37) refer to other metal lines at the respective levels (20) and (30), respectively. Via (33) on the upper level has border (31) and via (23) on the lower level has its border (21). Ideally, the pitch between metal lines such as (35) for the upper metal lines and (25) for the lower metal lines, is determined by the minimum line and space dimensions that can be patterned using the most recent advances in lithographic techniques. In practice, line pitch is also limited by the via size and the underlying metal pad size forming the border around the via, such as (31) and (21). It will be known by those skilled in the art that a border around a via is needed, for otherwise, grooves would be etched into the underlying insulating layer during the via-etch step, thus causing a thinning of the next level of metal deposited over the via. The minimum dimension by which the metal pad must frame the via, that is, form a border, is dependent on the misalignment tolerances of the lithography step.

Furthermore, the slope of the via wall must be taken into account when determining the minimum pitch between vias. Sloped walls are needed so that the vias can be filled more easily with metal, and without any voids inside the via holes. Also, appropriate slope is needed for adequate metal coverage over the step of the edge of the via hole when physical vapor deposition is employed. The step coverage is in turn dependent upon the aspect ratio, that is, depth over the width of the via hole. A cross-sectional view of vias (55) and (65) with sloped walls (57) and (67), respectively, is shown in FIG. 1b. It will be noted that the more is the slope of the via wall, the larger the border must be for the metal pad over the lower via to insure full coverage of the via.

It is also noted that the vias of FIG. 1a and FIG. 1b are formed laterally with respect to each other. That is, they are staggered rather than being stacked on top of one another as shown in FIG. 1c. The pitch between staggered vias can be reduced if the borders around the vias can also be reduced. The borders can be reduced if the slope of the walls can be reduced. The slope can be reduced if the holes can be filled properly with walls approaching vertical orientation. As is known in the art, forming metal plugs, such as tungsten plugs, in via holes separate from forming metal lines makes vertical vias possible. Plug forming methods are advantageous also in filling contact or via holes of different cross-sectional areas, though they may not fill the openings up to the top. This is shown by reference numerals (75) and (85) in FIG. 1c where vias (73) and (83) have more steeply sloped walls, and they span, respectively, insulation layers (70) and (80).

Vias with vertical walls, and wit no borders, can also be made, as disclosed later in this invention and as depicted in FIG. 2a. In FIG. 2a, vertical vias (93) and (103) are formed in insulating layers (90) and (100), respectively, connecting two metal layers (97) and (107). Thus, the minimum distance, such as (25) and (35) in FIG. 2b, between adjacent metal lines, is reduced since the vias have no slope. Secondly, the borders are no longer needed, since plugs (23), (33) in the completely filled vias provide ample overetch protection to underlying metal structures without mask coverage, as it will be appreciated by those skilled in the art. Even with borderless vias only, then, there is substantial reduction in the area occupied by these vias as shown in FIG. 2b in comparison with vias with borders of FIG. 1a. Hence, the pitch (35') between adjacent lines (37) and (37') can be reduced. The line pitch can be further reduced if the vias are stacked on top of one another as shown in FIG. 2c where upper vias (23), (23') and (23") are stacked on top of lower vias (33), (33') and (33"), thus significantly reducing upper metal line pitch from (35) to (35"), and lower metal line pitch from (25) to (25"). Hence, significant gains in packing density can be achieved with stacked and borderless contacts or vias.

However, the practice of stacking contacts and borderless contacts is still in its infancy, as observed by Sze in the earlier Reference. Conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with contact or via holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new metal lines, and the process is repeated as many times as it is needed to fabricate a semiconductor substrate. With this conventional process, lithographic alignment tolerances must be held very tight in order to form reliable borderless contacts or vias.

Some of the difficulties in forming borderless contacts have been addressed in prior art. For example, Barber, et al., in U.S. Pat. No 4,966,870 show a method for making borderless contacts through an insulating layer to active regions of a semiconductor device. After deposition of a silicon nitride layer and an insulation glass layer on a substrate coating semiconductor devices, the contact windows are etched. The windows are etched through the glass layer with $BCl_2$ or $CHF_3/CF_4$ etch gases. Next, the windows are etched through the silicon nitride with $CH_3F$ or $O_2/.CHF_3$ gases. Mu, et al., show several methods of forming an interconnect on a semiconductor substrate by using an etch-stop layer in U.S. Pat. No. 5,612,254. Chung, on the other hand, teaches, in U.S. Pat. No. 5,656,543, the fabrication of integrated circuits with borderless vias with the use of an etch-stop spacer whereby even if a via is misaligned with a metal line, a portion of the via not enclosed by the metal is enclosed by the etch-stop spacer. Givens, et al., disclose in U.S. Pat. No. 5,605,862 a process for making low-leakage contacts using differently doped layers. The present invention discloses a still another method of forming borderless contacts and vias with the attendant advantages of eliminating one photoresist mask, self-alignment capability, and easy photoresist stripping and cleaning, and hence, an over-all increase in manufacturability of borderless interconnects as will be apparent in the embodiments of the invention.

SUMMARY OF THE INVENTION

It is therefore an object of the present invention to provide method of forming borderless contacts using a metal contact plug etch-back process.

It is also an object of the present invention to provide method of forming borderless vias using a metal via plug etch-back process.

It is another object of this invention to provide a method of forming self-aligned and borderless contact and vias using an etch-back metal plug process requiring one less photolithographic process.

These objects are accomplished by providing a semiconductor substrate having a substructure comprising devices and/or metal layers formed therein; forming an interlevel dielectric (ILD) and/or intermetal dielectric (IMD) layer over said substrate; planarizing said ILD/IMD layer; forming an hard-mask layer over said ILD/IMD layer; forming a first photoresist layer over said hard-mask layer; patterning said first photoresist layer with a line trench pattern; etching through said line trench pattern in said first photoresist layer to form a line trench opening in said hard-mask layer; removing said first photoresist layer; forming a second photoresist layer over said hard-mask layer having said line trench opening; patterning said second photoresist layer with a contact hole pattern; etching through said contact hole pattern in said second photoresist layer to form a contact hole opening in said ILD/IMD layer until said substructure is reached; removing said second photoresist layer; forming a glue layer on the walls of said contact hole opening; depositing a plug metal in said contact hole opening; performing etch-back of said plug metal half way down the depth of said contact hole opening; etching further said line trench opening in said hard-mask layer into half way down the thickness of said ILD/IMD layer; forming metal over said substrate having said line trench opening; and removing said metal from the surface of said substrate for subsequent process steps to complete the fabrication of a semiconductor substrate.

DESCRIPTION OF THE PREFERRED EMBODIMENTS

Referring now the drawings, in particular to FIGS. 3a–3i, there is shown a method of forming borderless interconnects, specifically contacts and vias, using a plug metal etch-back process. It will be understood by those skilled in the art that contacts are formed in an insulating interlevel dielectric (ILD) layer in which the contacts provide connections between a source-drain, salicide or polysilicon to a metal layer, while vias are formed within upper dielectric layers referred to as intermetal dielectric (IMD) layer providing connection between metal layers. Since the present invention is applicable to both types of interconnects, they will be referred to, together, as contact/via interconnects.

Figure 1A:
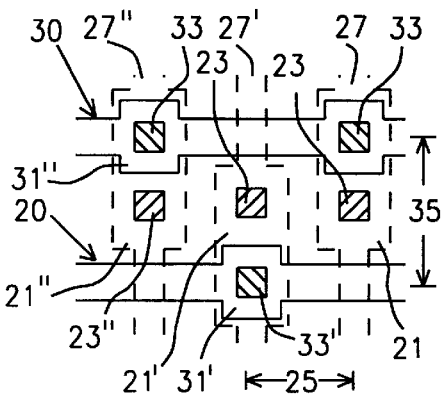
FIG. 1a shows a layout of two levels of metal lines on a semiconductor substrate and interconnected by means of staggered vias having sloped walls and borders, as practiced in prior art.
Figure 1B:
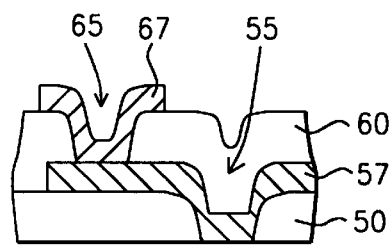
FIG. 1b shows a staggered vias having sloped walls of prior art.
Figure 1C:
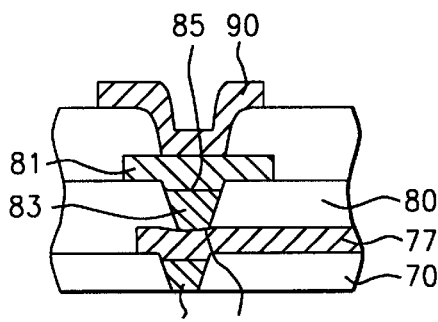
FIG. 1c shows stacked vias with borders of prior art.
Figure 2A:
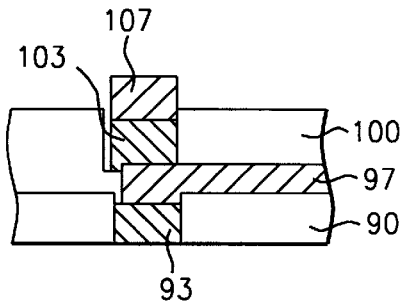
FIG. 2a shows borderless, vertical stacked vias of this invention.
Figure 2B:
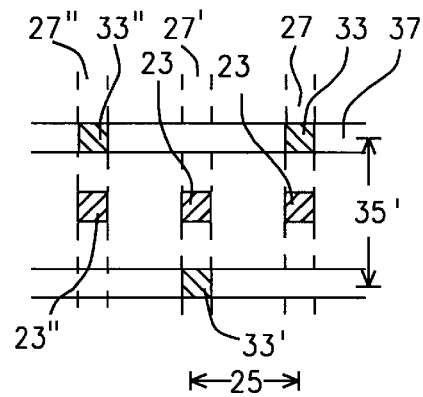
FIG. 2b shows a layout of two levels of metal lines interconnected through staggered and borderless vias of this invention.
Figure 2C:
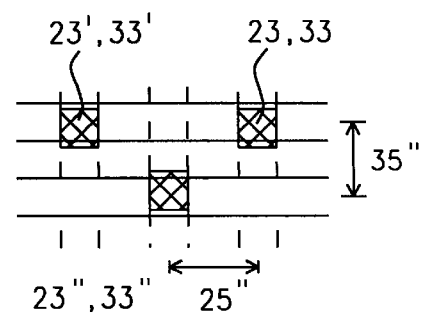
FIG. 2c shows a layout of two levels of metal lines interconnected through stacked and borderless vias of this invention.
Figure 3A:
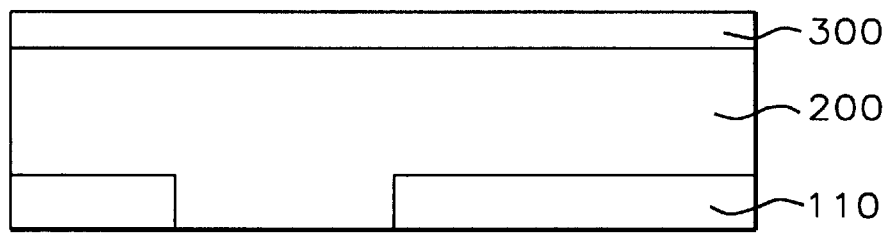
FIG. 3a shows a semiconductor substrate of this invention provided with a dielectric layer and the forming of a nitride layer of this invention thereon.

In FIG. 3a, a layer of ILD and/or IMD, (200), is formed over substrate (110) provided with a substructure of devices and/or metal layers. Dielectric layer (200) may be formed from silicon oxide materials through methods including but not limited do CVD, PECVD, PVD sputtering methods. For the preferred embodiment of the present invention, dielectric layer (200) comprises plasma enhanced tetraethyl orthosilicate (PETEOS) which is well known in the art. orthosilicate (PETEOS) which is well known in the art. Plasma enhanced oxide (PEOX) can also be used. It is preferred that PETEOS layer has a thickness between about 8000 to 12000 angstroms (Å). Next, an etch-stop layer (300), to serve as a hard-mask as is known in the art, is deposited. Preferably, hard-mask layer comprises silicon nitride $Si_3N_4$, having a thickness between about 500 to 1000 angstroms (Å). Silicon nitride is formed by reacting dichlorosilane ($SiCl_2H_2$) with ammonia ($NH_3$) in an LPCVD at a pressure between about 0.01 to 0.05 torr, temperature between about 700 to 900° C.

Figure 3B:
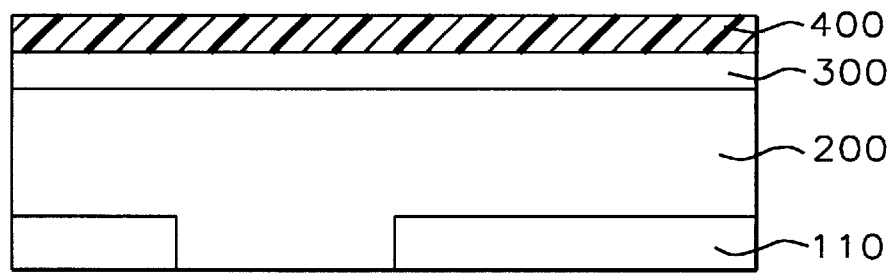
FIG. 3b shows the forming of a first photoresist layer on the nitride layer of FIG. 3a, according to this invention.
Figure 3C:
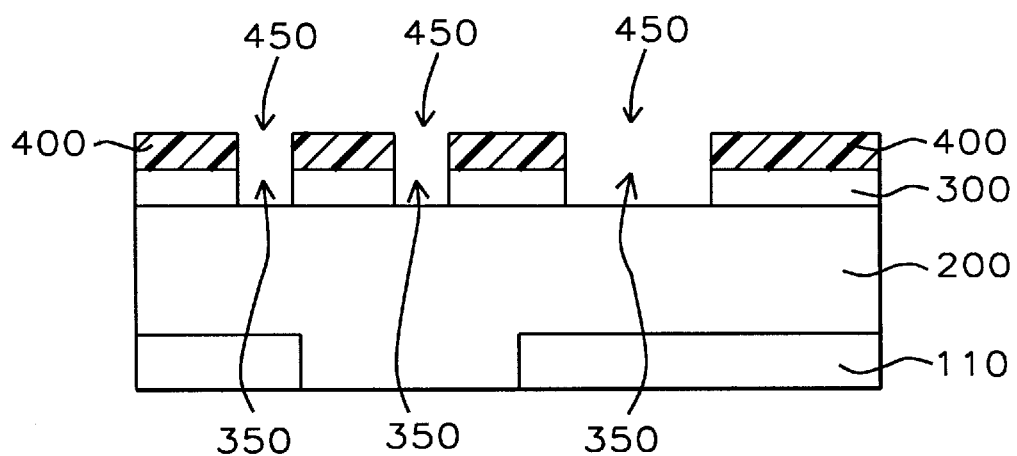
FIG. 3c shows the patterning of the nitride layer as a hard-mask of this invention using the line patterned potoresist layer.

After the forming of the dielectric and hard-mask layers, a first photoresist layer (400) of a thickness between about 8000 to 12000 Å is formed and then patterned with a mask having a metal line pattern (450), as shown in FIGS. 3b–3c. As a main feature and key aspect of the present invention, line pattern (450) is next etched only into nitride layer (300) to form line trench openings (350). The nitride etch is accomplished with a recipe comprising $SF_6$ and He. It will be noted in the Figures that the pattern openings formed in a particular layer are referenced by the first digit pertaining to that layer. Hence openings in layer (300) are referenced by numerals (350).

Figure 3D:
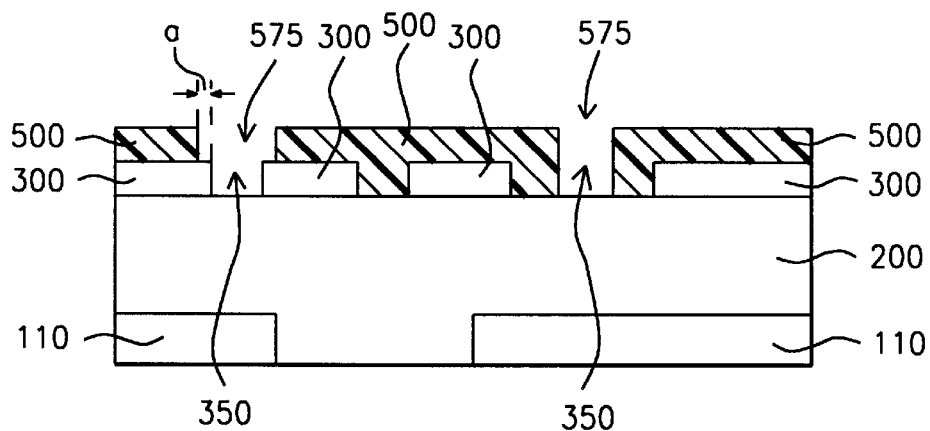
FIG. 3d shows the hole patterning of a second photoresist layer on the already line patterned hard-mask layer of this invention.

It will also be noted that unlike as is commonly practiced, etching of the line trench into the underlying dielectric layer is not continued as taught in this invention. On the contrary, the first photoresist layer is removed, using conventional techniques such as oxygen plasma ashing, and a second photoresist layer (500) is formed over the newly line patterned hard-mask layer (300). Second photoresist layer is in turn patterned with a mask having contact/via hole pattern (575). Because the underlying nitride layer (200) now serves as a hard-mask, it will be appreciated that the registration or alignment tolerance of the hole pattern with respect to the line trench pattern need not be tight. That is, any misalignment (a) of the pattern in the second photoresist layer as shown in FIG. 3d no longer affects the subsequent etching of pattern (350) into underlying layer (200) because the etching is controlled by the thin, hard-mask layer (300). Thus, the use of hard-mask layer (300) eliminates the need for borders for contact/via holes when the latter are formed in the sequence taught in this invention.

Figure 3E:
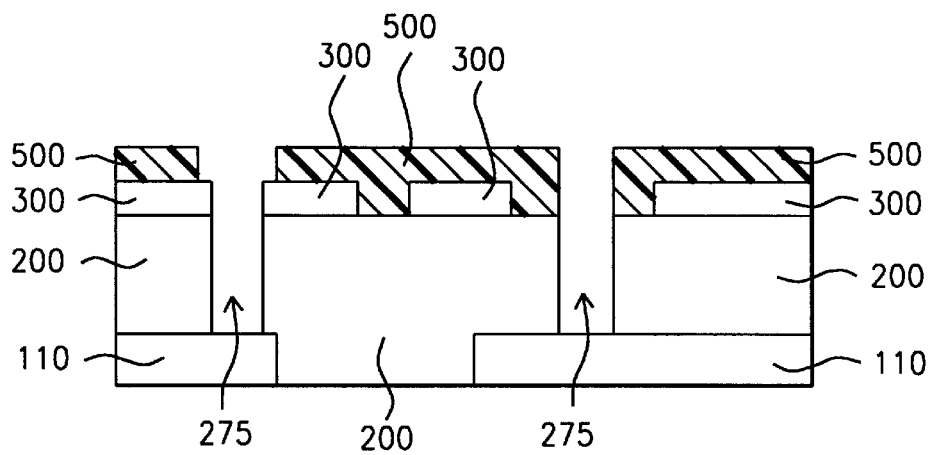
FIG. 3e shows the etching of the hole pattern into the dielectric layer, according to this invention.

Next, contact/via hole pattern (575) in second photoresist layer (500) is transferred into interlevel dielectric (ILD) layer (200) by performing an etch recipe comprising $CF_4$, $CHF_3$ and Ar. The etch is continued until substructure in substrate (110) is reached as shown in FIG. 3e. After the etch, the second photoresist layer is removed, again using oxygen plasma ashing techniques. It will be appreciated by those skilled in the art that stripping of the photoresist layer from the openings in the hard-mask of this invention is easy because the nitride layer is very thin.

As another key step of the present invention a "plug metal" is next deposited into the openings so formed in ILD layer (200). However, they are first lined with a "glue" layer (600) comprising titanium (Ti) or titanium nitride (TiN) to provide better adhesion between the dielectric walls of the openings and the metal that will subsequently be deposited into the same openings. As is known in the art, such adhesion promoters are used especially with tungsten metal. Thus, after the forming of glue layer, CVD tungsten is deposited onto the substrate to fill openings (275). Tungsten can be formed by silicon reduction, hydrogen reduction or silane reduction. It is preferred that the following silane reduction is used:

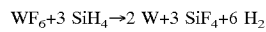

Figure 3F:
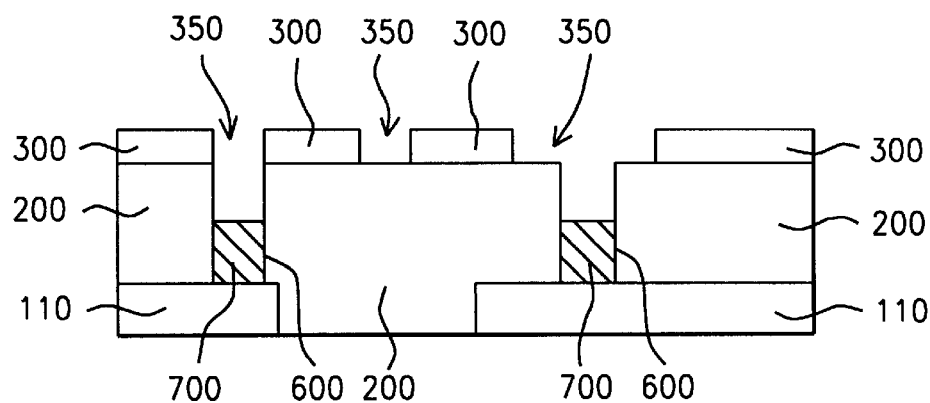
FIG. 3f shows the forming of a metal plug of this invention in the hole opening of FIG. 3e.

Following the deposition, CVD tungsten is etched back to form a plug, (700) only in the lower half of the opening (250) as shown in FIG. 3f.

Figure 3G:
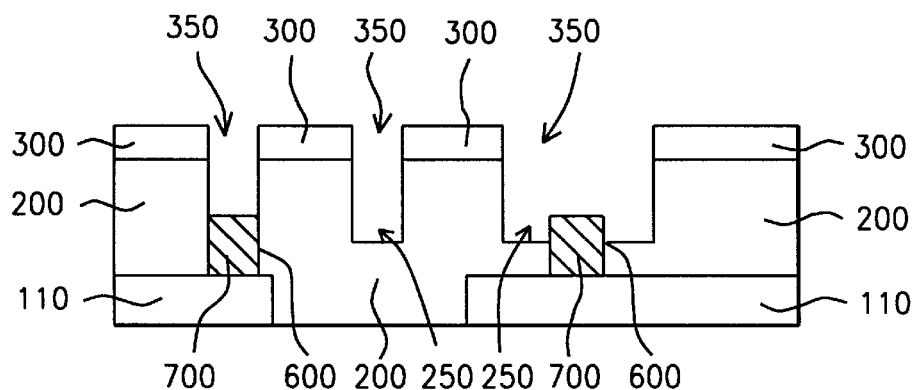
FIG. 3g shows the etching of the line pattern into the dielectric layer until the metal plug of this invention in FIG. 3f is reached.
Figure 3H:
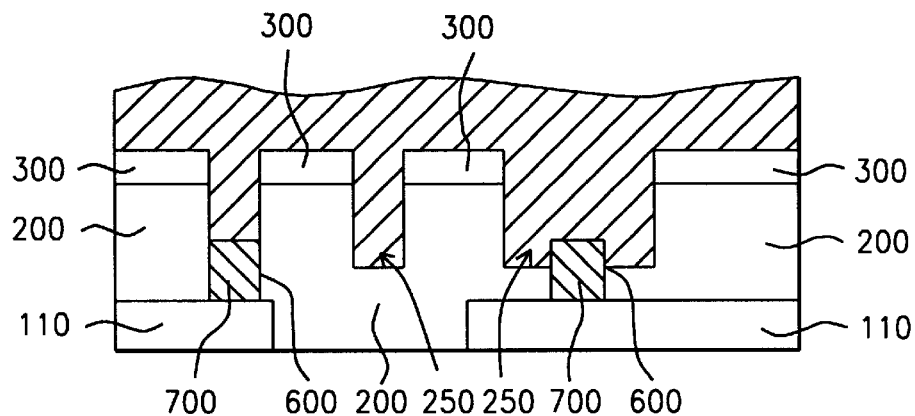
FIG. 3h shows the forming of metal over the openings of FIG. 3g, according to this invention.

After the metal plug etch-back, line trench opening (350) in hard-mask layer (300) is etched into ILD layer (200) as shown in FIG. 3g. It will be appreciated by those skilled in the art that using layer (300) as a mask eliminates a photolithographic step. It will also be known by those skilled in the art that organic materials, such as photoresist, are commonly used as a plug in openings such as shown in FIG. 3h. Organic materials are structurally weaker and they easily disintegrate, and they are difficult to clean afterwards. By using metal plug, the attendant problems are circumvented. The etching of line trench opening is accomplished with a recipe comprising $CH_2F_2$ and $C_4F_8$.

Figure 3I:
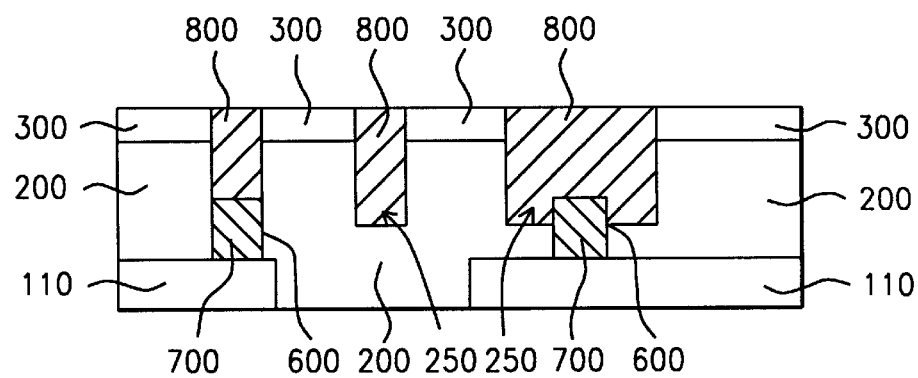
FIG. 3i shows the forming of an interconnect comprising a borderless contact or via hole, self-aligned to an underlying device area or metal line, according to this invention.

A metal layer (800), such as aluminum copper, or copper, is next deposited onto the substrate, filling line trench openings (350) as shown in FIG. 3h. Finally, excess metal is removed by chemical-mechanical polishing, thus forming a borderless contact/via hole, self-aligned to the metal layer or device regions of the underlying substructure of substrate (110) as shown in FIG. 3i.

While the invention has been particularly shown and described with reference to the preferred embodiments thereof, it will be understood by those skilled in the art that various changes in form and details may be made without departing from the spirit and scope of the invention.

What is claimed is:

1. A method of forming a borderless contact comprising the steps of:

providing a semiconductor substrate having a substructure comprising devices formed therein;

forming an interlevel dielectric (ILD) layer over said substrate;

planarizing said ILD layer;

forming an hard-mask layer over said ILD layer;

forming a first photoresist layer over said hard-mask layer;

patterning said first photoresist layer with a line trench pattern;

etching through said line trench pattern in said first photoresist layer to form a line trench opening in said hard-mask layer;

removing said first photoresist layer;

forming a second photoresist layer over said hard-mask layer having said line trench opening;

patterning said second photoresist layer with a contact hole pattern;

etching through said contact hole pattern in said second photoresist layer to form a contact hole opening in said ILD layer until said substructure is reached;

removing said second photoresist layer;

forming a glue layer on the walls of said contact hole opening;

depositing a plug metal in said contact hole opening;

performing etch-back of said plug metal half way down the depth of said contact hole opening;

etching further said line trench opening in said hard-mask layer into half way down the thickness of said ILD layer;

forming metal over said substrate having said line trench opening; and removing said metal from the surface of said substrate for subsequent process steps to complete the fabrication of a semiconductor substrate.

2. The method of claim 1, wherein said planarizing is accomplished with chemical-mechanical polishing.

3. The method of claim 1, wherein said ILD layer comprises PETEOS or PEOX.

4. The method of claim 1, wherein said ILD layer has a thickness between about 8000 to 12000 Å.

5. The method of claim 1, wherein said forming an hard-mask layer over said ILD layer is accomplished by reacting dichlorosilane ($SiCl_2H_2$) with ammonia ($NH_3$) in an LPCVD at a pressure between about 0.01 to 0.05 torr, temperature between about 700 to 900° C.

6. The method of claim 5, wherein said hard-mask layer is silicon nitride having a thickness between about 500 to 1000 angstroms (Å).

7. The method of claim 1, wherein said first photoresist layer over said ILD layer has a thickness between about 0.8 to 1.2 micrometers ($\mu$m).

8. The method of claim 1, wherein said patterning said first photoresist layer is accomplished with a mask having said line trench pattern.

9. The method of claim 1, wherein said etching through said line trench pattern in said first photoresist layer into said hard-mask layer is accomplished with a recipe comprising $SF_6$ and He.

10. The method of claim 1, wherein said removing said first photoresist layer is accomplished with oxygen plasma ashing.

11. The method of claim 1, wherein said second photoresist layer over said hard-mask layer having said line trench opening has a thickness between about 0.8 to 1.2 $\mu$m.

12. The method of claim 1, wherein said etching through said contact hole pattern in said second photoresist layer to form a contact hole opening in said ILD layer until said substructure is reached is accomplished with a recipe comprising $CF_4$, $CHF_3$, and Ar.

13. The method of claim 1, wherein said second photoresist layer is removed by oxygen ashing.

14. The method of claim 1, wherein said forming a glue layer on the walls of said contact hole opening is accomplished by depositing titanium nitride.

15. The method of claim 1, wherein said depositing a plug metal in said contact hole opening is accomplished by depositing CVD tungsten using silane reduction.

16. The method of claim 1, wherein said etching further said line trench opening in said hard-mask layer into half way down the thickness of said ILD layer is accomplished with a recipe comprising $CH_2F_2$ and $C_4F_8$.

17. The method of claim 1, wherein said forming metal over said substrate having said line trench opening is accomplished by depositing copper.

18. The method of claim 1, wherein said removing said metal from the surface of said substrate is accomplished by chemical mechanical polishing.

19. A method of forming a borderless via comprising the steps of:

providing a semiconductor substrate having a substructure comprising a metal layer formed therein;

forming an intermetal dielectric (IMD) layer over said substrate;

planarizing said IMD layer;

forming a hard-mask layer over said IMD layer;

forming a first photoresist layer over said hard-mask layer;

patterning said first photoresist layer with a line trench pattern;

etching through said line trench pattern in said first photoresist layer to form a line trench opening in said hard-mask layer;

removing said first photoresist layer;

forming a second photoresist layer over said hard-mask layer having said line trench opening;

patterning said second photoresist layer with a via hole pattern;

etching through said via hole pattern in said second photoresist layer to form a via hole opening in said IMD layer until said substructure is reached;

removing said second photoresist layer;

forming a glue layer on the walls of said via hole opening;

depositing a plug metal in said via hole opening;

performing etch-back of said plug metal half way down the depth of said via hole opening;

etching further said line trench opening in said hard-mask layer into half way down the thickness of said IMD layer;

forming metal over said substrate having said line trench opening; and removing said metal from the surface of said substrate for subsequent process steps to complete the fabrication of a semiconductor substrate.

20. The method of claim 19, wherein said planarizing is accomplished with chemical-mechanical polishing.

21. The method of claim 19, wherein said IMD layer comprises PETEOS or PEOX.

22. The method of claim 19, wherein said IMD layer has a thickness between about 8000 to 12000 Å.

23. The method of claim 19, wherein said forming an hard-mask layer over said IMD layer is accomplished by reacting dichlorosilane ($SiCl_2H_2$) with ammonia ($NH_3$) in an LPCVD at a pressure between about 0.01 to 0.05 torr, temperature between about 700 to 900° C.

24. The method of claim 23, wherein said hard-mask layer is silicon nitride having a thickness between about 500 to 1000 angstroms (Å).

25. The method of claim 19, wherein said first photoresist layer over said IMD layer has a thickness between about 0.8 to 1.2 micrometers ($\mu$m).

26. The method of claim 19, wherein said patterning said first photoresist layer is accomplished with a mask having said line trench pattern.

27. The method of claim 19, wherein said etching through said line trench pattern in said first photoresist layer into said hard-mask layer is accomplished with a recipe comprising $SF_6$ and He.

28. The method of claim 19, wherein said removing said first photoresist layer is accomplished with oxygen plasma ashing.

29. The method of claim 19, wherein said second photoresist layer over said hard-mask layer having said line trench opening has a thickness between about 0.8 to 1.2 $\mu$m.

30. The method of claim 19, wherein said etching through said via hole pattern in said second photoresist layer to form a via hole opening in said IMD layer until said substructure is reached is accomplished with a recipe comprising $CF_4$, $CHF_3$ and Ar.

31. The method of claim 19, wherein said second photoresist layer is removed by oxygen ashing.

32. The method of claim 19, wherein said forming a glue layer on the walls of said via hole opening is accomplished by depositing titanium nitride.

33. The method of claim 19, wherein said depositing a plug metal in said via hole opening is accomplished by depositing CVD tungsten using recipe silane reduction.

34. The method of claim 19, wherein said etching further said line trench opening in said hard-mask layer into half way down the thickness of said IMD layer is accomplished with a recipe comprising $CH_2F_2$ and $C_4F_8$.

35. The method of claim 19, wherein said forming metal over said substrate having said line trench opening is accomplished by depositing copper.

36. The method of claim 19, wherein said removing said metal from the surface of said substrate is accomplished by chemical mechanical polishing.

\* \* \* \* \*